United States Patent [19]

Woo

[11] Patent Number: 4,833,099
[45] Date of Patent: May 23, 1989

[54] TUNGSTEN-SILICIDE REOXIDATION PROCESS INCLUDING ANNEALING IN PURE NITROGEN AND SUBSEQUENT OXIDATION IN OXYGEN

[75] Inventor: Been-Jon Woo, Saratoga, Calif.

[73] Assignee: Intel Corporation, Santa Clara, Calif.

[21] Appl. No.: 142,906

[22] Filed: Jan. 7, 1988

[51] Int. Cl.[4] .......................................... H01L 21/316
[52] U.S. Cl. ........................................ 437/41; 437/56; 437/239; 437/200; 437/983; 437/949; 148/DIG. 3; 148/DIG. 147; 148/DIG. 118
[58] Field of Search ............... 437/238, 239, 192, 200, 437/201, 41, 42, 43, 44, 56, 983, 949; 148/DIG. 147, DIG. 3, DIG. 118

[56] References Cited

U.S. PATENT DOCUMENTS

| | | |
|---|---|---|
| 4,128,670 | 12/1978 | Gaensslen . |
| 4,285,761 | 8/1981 | Fatula, Jr. et al. ........ 148/DIG. 147 |
| 4,378,628 | 4/1983 | Levinstein et al. .................... 437/70 |
| 4,567,058 | 1/1986 | Koh ........................................ 427/55 |
| 4,616,399 | 10/1986 | Ooka ...................................... 437/44 |
| 4,728,617 | 3/1988 | Woo et al. ............................. 437/30 |

OTHER PUBLICATIONS

M. Y. Tsai et al., "One-Micron Polycide (WSi on POLY-Si) MOSFET Technology"; J. Electrochem. Soc.: Solid-State Science and Technology; Oct. 1981; pp. 2207-2214.
S. Zirinsky et al., "Oxidation Mechanisms in WSi$_2$ Thin Films"; Appl. Phys. Lett. 33(1); Jul. 1, 1978; pp. 76-78.
F. Mohammadi et al., "Kinetics of the Thermal Oxidation of WSi$_2$"; Appl. Phys. Lett., vol. 35, No. 7; Oct. 1, 1979; pp. 530-531.
M. Ayukawa et al., "CVD WSi$_x$ Oxidation Characteristics with Ion Implantation Method"; V-MIC Conf.; Jun. 15-16, 1978; pp. 314-320.

Primary Examiner—Brian E. Hearn
Assistant Examiner—T. N. Quach
Attorney, Agent, or Firm—Blakely, Sokoloff, Taylor & Zafman

[57] ABSTRACT

A tungsten silicide reoxidation technique for forming a reoxidation layer in a CMOS device is disclosed. After forming an insulated gate member, which has a silicon-rich tungsten silicide layer overlying a polysilicon layer, it is first oxidized and the oxide is removed to expose WSi for forming a particular source/drain doped device. Then it is annealed in a substantially pure nitrogen ambient for a given time period. A subsequent growth of the reoxidation layer over the gate member by introducing oxygen results in a substantially planarized surface. The combination between tungsten and oxygen is prevented.

12 Claims, 3 Drawing Sheets

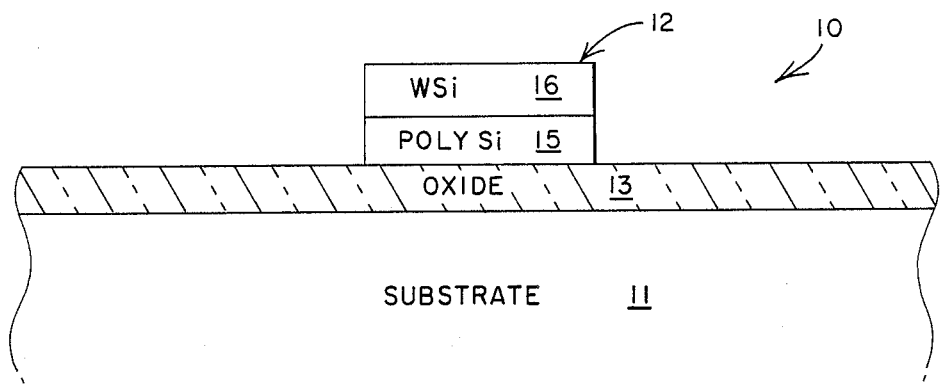
FIG_1
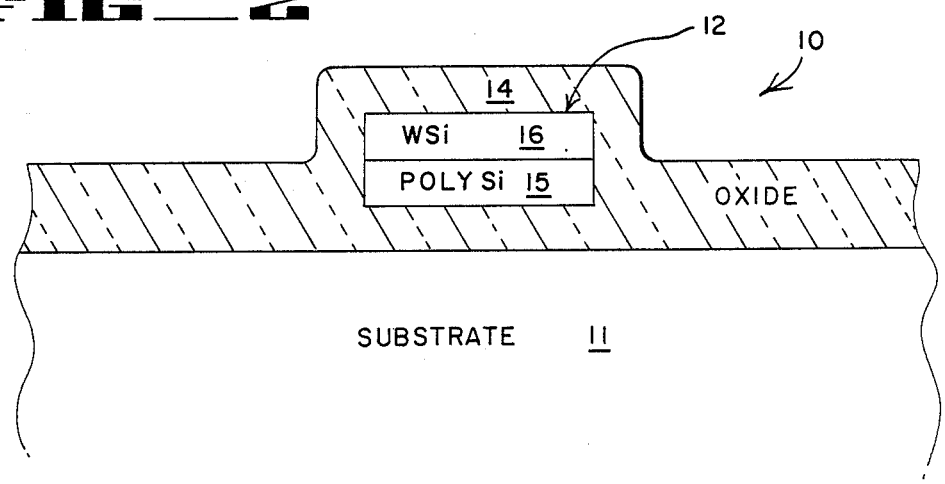
FIG_2
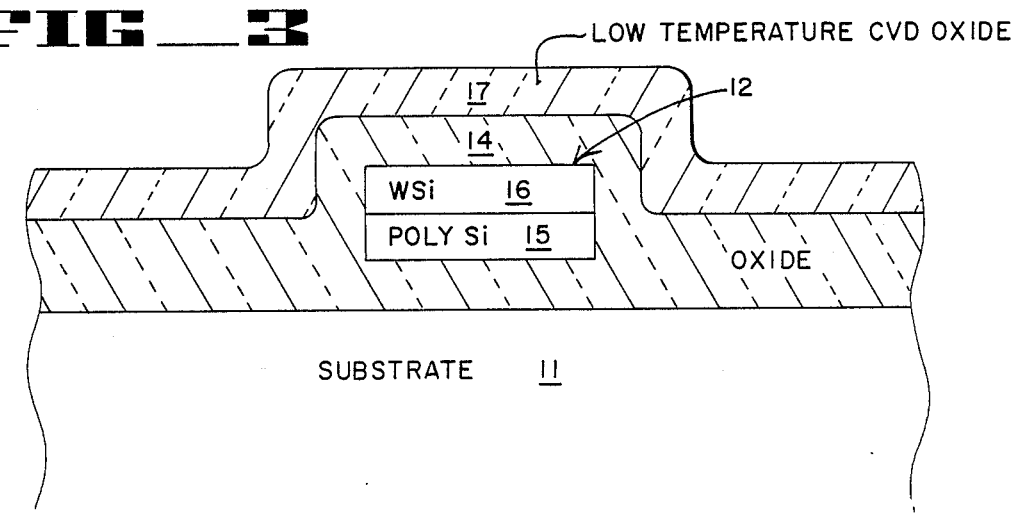
FIG_3

FIG_4A
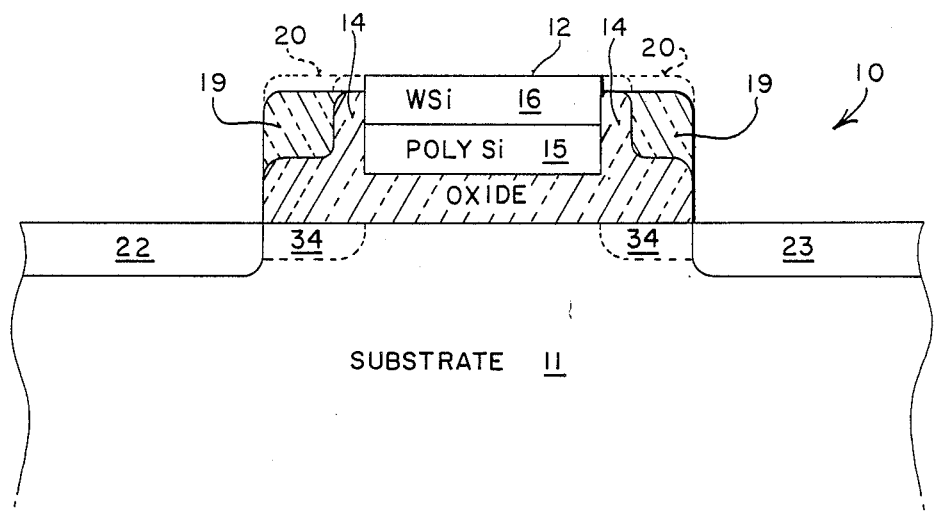
FIG_4B
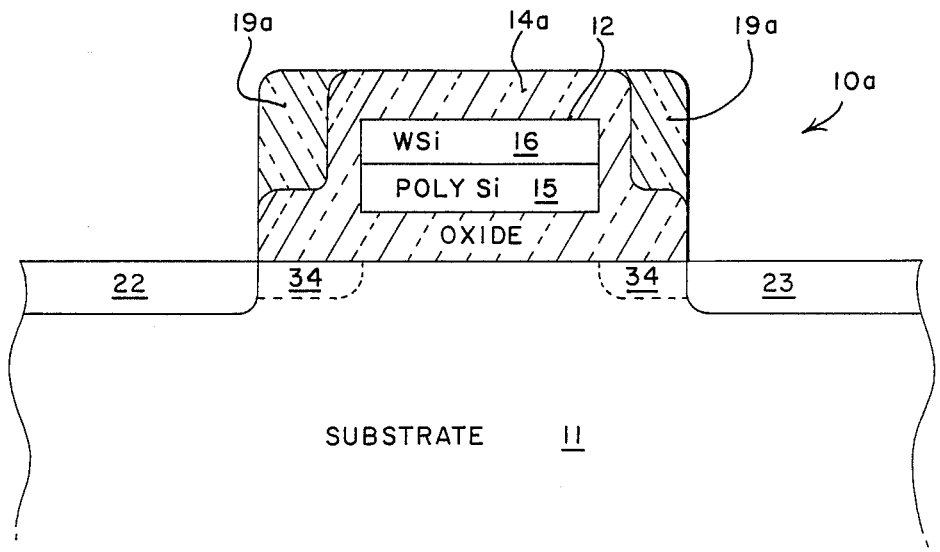

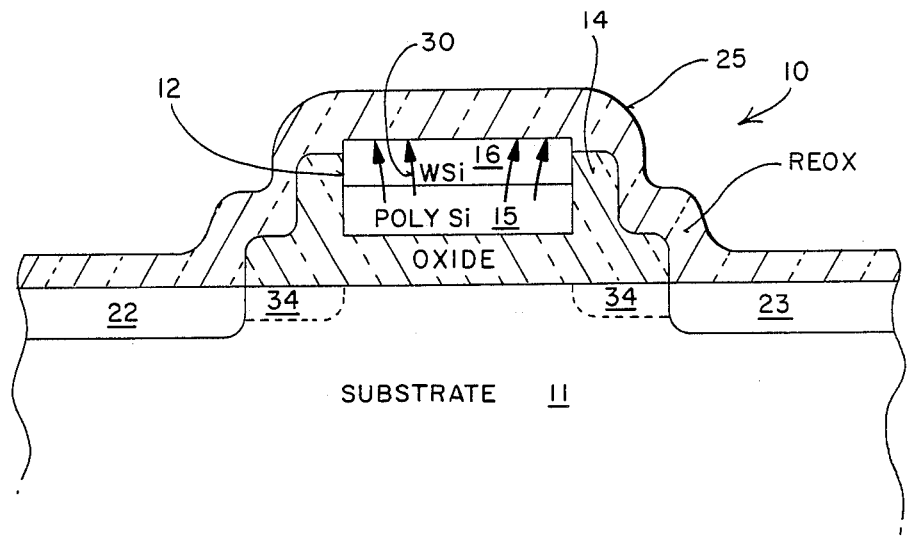
FIG_5
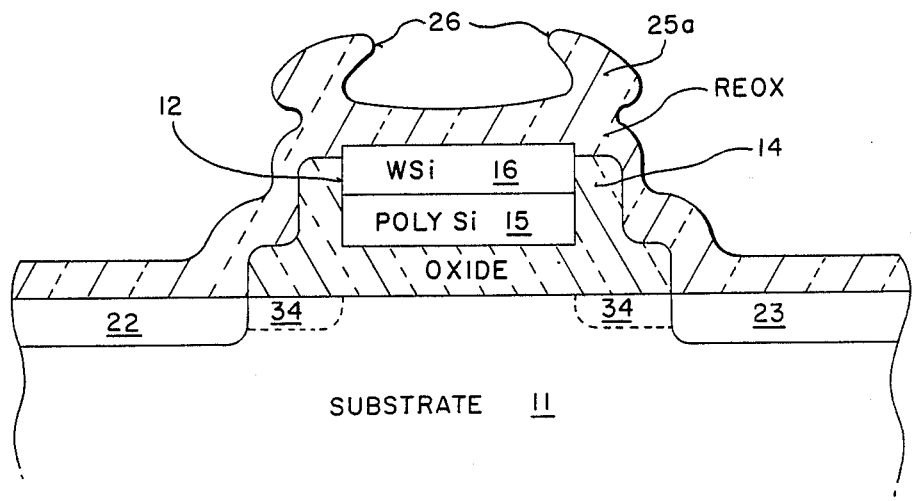
FIG_6

TUNGSTEN-SILICIDE REOXIDATION PROCESS INCLUDING ANNEALING IN PURE NITROGEN AND SUBSEQUENT OXIDATION IN OXYGEN

BACKGROUND OF THE INVENTION

1. Field of the Invention

This invention relates to the field of metal-oxide-semiconductor (MOS) fabrication, and more particularly to a process for forming a reoxidation layer over a gate element during the fabrication of complementary metal-oxide-semiconductor (CMOS) devices.

2. Prior Art

In the manufacture of metal-oxide-semiconductor field effect transistors (MOSFETs), a technique of using tungsten to form a silicide is well-known in the prior art. These metallic silicides, and more specifically tungsten silicide (WSi), are deposited above a polysilicon layer to form a gate member. A silicide layer is used in the gate member to provide a better contact between the gate member and interconnection lines which interconnect the gate member to various other elements of the device. Typically, these interconnection lines are fabricated from aluminum.

In the manufacture of these MOSFET devices, a polysilicon layer is formed over a dielectric layer, such as an oxide, and the silicide layer is deposited over the polysilicon layer to form a gate member. Then, source and drain regions are formed. In one process using a lightly doped drain technique, a first oxide layer is formed over the gate member, a CVD spacer oxide is deposited and various photolithographic and etching techniques are used to shape the gate region for forming lightly doped drain and source regions. The drain and source regions are doped by known techniques, such as by using implantation techniques. Then the oxide spacer layer is removed exposing the silicide portion of the gate member. One such lightly doped technique is described in copending application Ser. No. 926,733 filed Nov. 4, 1986 now U.S. Pat. 4,728,617; and titled "Method of fabricating a MOSFET with graded source and drain regions". Then prior to the deposition of subsequent upper layers, such as the interdielectric layer, a reoxidation technique is used to form a second oxide (reoxidation) layer over the gate member. A reoxidation layer is used in order to ensure good gate edge quality to obtain higher gate edge oxide breakdown voltage, as well as annealing the source and drain dopants. A popular technique is to grow a silicon dioxide ($SiO_2$) layer over the silicide gate member in which silicon atoms are supplied by the silicide layer because it is silicon rich as deposited and combine with the oxygen atoms to grow a $SiO_2$ layer over the gate member.

Various prior art techniques describe methods of providing the technique of forming the first oxidation:

(1). "One-Micron Polycide ($WSi_2$ on Poly-Si) MOSFET Technology"; M. Y. Tsai et al; Journal of Electrochem. Soc.; Solid State Science and Technology; October 1981; pp. 2207–2214.

(2). "Oxidation mechanisms in $WSi_2$ thin films"; S. Zirinsky et al; Appl.Phys.Lett., 33(1); American Institute of Physics; July 1, 1978; pp. 76–78.

(3). "Kinetics of the thermal oxidation of $WSi_2$"; F. Mohammadi et al; Appl.Phys.Lett.; Vol. 35, No. 7; Oct. 1, 1979; pp. 529–531.

However, at the reoxidation step, the silicide film will exhibit a rough textured surface and further causes a non-uniform concentration of tungsten atoms which is supplied by the silicide when Si is not present in an oxidized ambient. As the reoxidation layer is grown over the oxidized silicide, a rough textured oxide deposit is formed above the silicide region of the gate member instead of a smooth planarized surface. In many instances curved "horns" form over the gate member. The non-planarized surface makes it difficult, and in some instances impossible, to form subsequent layers on the silicide portion of the gate member.

To alleviate this problem, one disclosed technique implants phosphorus into the silicide layer to pretreat the silicide prior to the reoxidation occurring. One such technique is disclosed in (4) "CVD WSix Oxidation Characteristics with Ion Implantation Method"; M. Ayukawa et al; V-MIC Conf., IEEE; June 15–16, 1987; pp. 314–320. However, the phosphorus implantation technique disclosed in Reference 4 is not compatible for use in the fabrication of CMOS devices because of the presence of p-channel transistors in a CMOS device.

Therefore, what is required is a reoxidation technique for forming a reoxidation layer over a silicide region of a gate member wherein this technique can be used with a CMOS device which is comprised of both n-channel and p-channel transistors.

SUMMARY OF THE INVENTION

A novel technique for forming a reoxidation layer on a tungsten silicide gate is described. An insulated gate member having a polysilicon layer on a WSi layer is formed above a silicon substrate having a silicon dioxide insulating layer. A first oxidation layer is formed about the gate. Then a low temperature chemical vapor deposition (CVD) oxide layer is formed above the first oxidation layer and both are etched so that only a portion of the (CVD) oxide and the first oxidation layers remain to form spacers about the gate member. Next, spaced apart source and drain regions are formed. The spacers are then removed. Prior to forming a reoxidation layer, the device is placed in a furnace having a substantially pure nitrogen ambient. The annealing step inhibits tungsten atoms from reacting with oxygen atoms and further releases silicon atoms from the polysilicon layer. The duration of the annealing step is dependent on the temperature of the furnace. After the annealing step, oxygen is introduced into the furnace so that oxygen atoms will combine with the silicon atoms to form the reoxidation layer. Because of the lack of tungsten-oxygen reaction, a substantially planar and uncontaminated reoxidation layer is formed.

BRIEF DESCRIPTION OF THE DRAWINGS

FIG. 1 illustrates the formation of an insulated gate member on a substrate when the gate member is comprised of a polysilicon layer underlying a tungsten silicide layer.

FIG. 2 illustrates formation of a first oxide layer about the gate member.

FIG. 3 illustrates the deposition of a low temperature CVD oxide layer over the first oxide layer.

FIG. 4a illustrates the etching of the oxide layer to form spacer elements about the gate member and doped drain and source regions.

FIG. 4b illustrates an alternative embodiment in the formation of the spacers and the doped drain and source regions.

FIG. 5 illustrates the formation of a typical reoxidation layer when practicing the process of the present invention.

FIG. 6 illustrates an undesirable effect which results during the reoxidation step, wherein this undesirable effect is cured by the practice of the present invention.

DETAILED DESCRIPTION OF THE PRESENT INVENTION

The present invention describes a technique for forming a reoxidation layer in a CMOS MOSFET device. In the following description, numerous specific details are set forth such as specific thickness, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

Referring to FIG. 1, a semiconductor device 10 is shown having a gate 12 formed over a substrate 11. Substrate 11 is comprised of silicon and is separated from the gate 12 by a dielectric layer 13 which is typically comprised of an oxide layer such as $SiO_2$. The gate 12 is comprised of a lower layer 15 comprised of polysilicon and an upper layer 16 comprised of WSi. The formation of oxide layer 13, polysilicon layer 15 and WSi layer 16 to form an insulated gate 12 is well-known in the prior art. The earlier stated references 1, 2 and 3 describe formation of an oxide layer on a silicide layer 16 over a polysilicon layer 15. As used in a preferred embodiment, a silicide layer 16 initially is amorphous and has a composition of $WSi_{2.7}$ which is silicon rich.

Referring to FIG. 2, a first oxidation step provides for the first oxidation of the deposited WSi layer 16. The purpose of oxide layer 14 of the preferred embodiment is to provide an oxide layer for the unique graded source and drain CMOS MOSFET device which is described in the aforementioned copending patent application. Further, this step has been described in references 1-3, which use excessive amounts of silicon atoms supplied by as-deposited $WSi_{2.7}$ to react with oxygen atoms in oxidation ambient to form layer 14. This oxidation step typically will increase the thickness of the original oxide layer 13.

Then a chemical vapor deposition (CVD) deposited oxide layer 17 is formed along the side walls and upper surface of gate 12 and oxide layer 14, as is shown in FIG. 3. The preferred embodiment uses a low temperature thermal oxide (LTO) technique to deposit oxide layer 17. Next, oxide layer 17 is etched back using an anisotropic etching technique which is well-known in the prior art, to form spacers 19 as shown in FIG. 4a.

In FIG. 4a, because of the anisotropic etch, side members or spacers 19 are formed along the side walls of gate 12 adjacent to oxide layer 14. These spacers 19 can be at the same height as gate 12 (as shown by dotted lines 20 in FIG. 4a), or in some instances spacers 19a may be higher than gate 12 as is shown in FIG. 4b. This is due to a thin layer of oxide layer 14a which may remain on the upper surface of gate 12. It is appreciated that the preferred embodiment uses oxide layer 17 to form spacers 19 during the first oxidation sequence. However, the reoxidation technique described below can be used without layer 17 or spacers without departing from the spirit and scope of the invention.

Further, various technique are available to form differently shaped spacers 19 to improve the implantation of adjacent drain and source regions which will be formed for device 10. A technique to form the device 10 (and 10a) shown in FIG. 4a and 4b, along with the implantation of source and drain regions, including tip implants 34, is disclosed in the afore-mentioned copending application Ser. No. 926,733. The formation of a two layered silicide gate 12 is well documented in references 1-3. During the first oxidation step, the amorphous silicide $WSi_{2.7}$ is crystalized to form $WSi_{2.2}$. Then, CVD oxide spacers 19 are formed. Then, adjacent source and drain regions 22-23 are formed, such as by implantation as is described in the above-mentioned copending application. The oxide spacers 19 are typically removed before the reoxidation step and also before annealing the source and drain regions 22-23. As to the structure of FIG. 4b, the etching step for removing the spacers 19a will also typically etch back oxide layer 14a such that the WSi layer 16 is exposed at the upper surface. In essence, FIG. 4b will eventually appear to resemble that of FIG. 4a before device 10 is subjected to reoxidation.

Referring to FIG. 5, it shows an ideal situation when layer 25, which comprises the reoxidation layer, is formed above oxide layer 14 and gate 12 of FIG. 4a. The formation of oxide layer 25 can only be achieved if silicon atoms are supplied from the polysilicon layer 15 prior to the reoxidation step commencing. The silicon atoms will react with the oxygen atoms introduced into the oxidation chamber and arrows 30 illustrate the transfer of silicon atoms from polysilicon layer 15. The silicon atoms need to be supplied from polysilicon layer 15 instead of WSi layer 16 because excess silicon atoms are not available at the exposed portion of crystallized $WSi_{2.2}$ layer 16. The transfer of silicon atoms from polysilicon layer 15 is accomplished by the application of heat ambient.

In practice, during the formation of reoxidation layer 25 "horns" 26, as shown in FIG. 6, form above the gate region making oxide layer 25a unacceptable for formation of subsequent layers. Concentration of tungsten atoms drawn from the silicide layer 16 causes roughened surfaces on the reoxidation layer and these tungsten atoms combine with oxygen atoms to form "horns" 26.

Referring again to FIG. 5, the preferred technique of the present invention for forming reoxidation layer 25 is shown. Prior to the formation of layer 25, the partly constructed device 10 as shown in FIG. 4a is formed by prior art techniques explained above. The spacers 19 are formed and removed after dopant implant by techniques described in the aforementioned copending application. Device 10 is then placed into a preheated furnace which contains almost pure $N_2$.

In actuality, the process of the preferred embodiment slowly "pushes" the device 10 into the preheated furnace or chamber which is comprised of $N_2$ having at least 99.5% purity. The required time that device 10 must stay in this heated $N_2$ environment is dependent on the furnace temperature. The selected temperature must be low enough to prevent n-channel and p-channel source/drain dopant cross contamination of the device, yet sufficiently high to cause the silicon atoms to be pulled from the polysilicon layer 15 and to allow the silicon atoms to react with the oxygen atoms in the chamber during reoxidiation. The heating of the device 10 in substantially pure $N_2$ is for the purpose of annealing gate 12 and the surface of silicide layer 16, as well as pulling silicon atoms from polysilicon layer 15. This annealing step prior to reoxidation prevents tungsten atoms from reacting with the oxygen during the reoxidation step, so as to result in a sufficiently planarized reoxidation layer 25. It is to be appreciated that nitrogen anneal at less than 99.5% nitrogen purity will result in the formation of "horns" 26.

Further, as is explained in the copending application, the source 22 and drain 23 can be made to extend under oxide 14 prior to the formation of reoxidation layer 25.

Examples are illustrated below to describe specific parameters needed in growing reoxidation layer 25 subsequent to $N_2$ anneal. Although three examples are provided, it is to be appreciated that various other combinations will function equivalently to form oxide layer 25. As used in the preferred embodiment, oxide layer 25 is a thermal oxide layer, but is not a low temperature oxide.

Example 1

Nitrogen (at least 99.5% pure) is heated to 775° C. in a furnace. A device of FIG. 4a, after having its first oxidation layer, spacers, source and drain regions formed and subsequently having the spacers removed, is placed into the furnace for approximately nine minutes to anneal gate 12. Then, the temperature is ramped 5 Centigrade degree per minute (°C./min.) in $N_2$ ambient until 900° C. is reached. Next, temperature is ramped in an oxygen ($O_2$) ambient until the temperature reaches 920° C. at a ramped rate of 5° C./min. The device 10 is subjected to 920° C. for 40 minutes for source/drain dopant anneal of the implanted regions 22 and 23. Next, $O_2$ is introduced for approximately 60 minutes to grow the reoxidation layer 25.

EXAMPLE 2

Substantially pure $N_2$ (at least 99.5% pure) is heated to 775° C. in a furnace. The device of FIG. 4a, after having the spacer removed as in Example 1, is placed into the chamber for approximately nine minutes to anneal gate 12. Then, the temperature is ramped at 5° C./min. in 90% $N_2$ and 10% $O_2$ ambient until 920° C. is reached. The device 10 is subjected to 920° C. for 40 minutes for source/drain dopant anneal. Next, $O_2$ is introduced for 60 minutes to grow reoxidation layer 15.

EXAMPLE 3

Substantially pure $N_2$ (at least 99.5%) is heated to 700° C. in a furnace. The device of FIG. 4a is placed in the furnace for approximately 30 minutes to anneal the gate 12. Then substantially pure $O_2$ is introduced into the chamber until the temperature is ramped up to 920° C. at 5° C./min. The device is subjected to $N_2$ for 40 minutes at 920° C. for source/drain dopant anneal. Next $O_2$ is introduced and the reoxidation layer 25 is grown for 60 minutes at 920° C.

In the above three examples, it is appreciated that all values are approximate due to the tolerances built into the values given. By subjecting the device to $N_2$ anneal prior to the introduction of $O_2$, which combines with the Si being pulled from the polysilicon layer 15 of gate 12 to form the $SiO_2$ reoxidation layer 25, irregular reoxidation of WSi is avoided. This process results in an improved formation of the reoxidation layer 25 in a CMOS MOSFET device. As used in the preferred embodiment, the process is used to fabricate CMOS electrically programmable read only memory (EPROM) devices having less than one micron transistor elements. The preferred embodiment has layer 25 grown to appoximately 500 angstroms on top of the exposed WSi 16. However, the actual thickness will depend on the purity of the nitrogen ambient and the length of the oxidation cycle.

Thus a novel technique for WSi reoxidation technique is described.

I claim:

1. A method of fabricating a complementary metal-oxide semiconductor (CMOS) integrated circuit where a reoxidation layer is formed on an insulated gate member which overlies a substrate and in which said insulated gate member is comprised of an amorphous silicon-rich tungsten silicide layer overlying a polysilicon layer, comprising the following steps in the order named of:
   (a) forming an oxidation insulating layer using excessive silicon atoms from said silicon-rich tungsten silicide layer over opposite sides and upper surface of said gate member;
   (b) forming spacers about said gate member;
   (c) etching said oxidation insulating layer to expose upper surface of said silicide layer of said gate member;
   (d) forming source and drain regions in said substrate adjacent to said gate member;
   (e) annealing said gate member after said oxidation insulating layer has been etched from said upper surface of said silicide layer of said gate member in a furnace having substantially pure nitrogen ambient to anneal said silicide layer and freeing silicon atoms from said polysilicon layer;
   (f) forming said reoxidation layer about said gate member by introducing oxygen into said heating furnace, wherein oxygen atoms react with said silicon atoms to form said reoxidation layer such that said reoxidation layer is substantially planarized and uncontaminated.

2. The method defined in claim 1 wherein said substantially pure nitrogen ambient is comprised of at least 99.5% nitrogen.

3. The method of claim 2 wherein said furnace is preheated to a temperature of approximately 775° C. and said annealing step is achieved at said temperature.

4. The method of claim 3 wherein said annealing step is approximately 9 minutes in duration.

5. The method of claim 2 wherein said furnace temperature is approximately 700° C. and said annealing step is approximately 30 minutes in duration.

6. A method of fabricating a complementary metal-oxide-semiconductor (CMOS) field-effect transistor integrated circuit where a reoxidation layer is formed on an insulated gate member which overlies a substrate and in which said insulated gate member is comprised of a silicon-rich tungsten silicide layer overlying a polysilicon layer, comprising the steps in the sequence that follows of:
   (a) forming a first silicon oxide insulating layer using excessive silicon atoms supplied from said silicon-rich tungsten silicide layer over opposite sides and upper surface of said gate member;
   (b) forming a low temperature oxide insulating layer over said first oxide insulating layer;
   (c) etching said first oxide and said low temperature oxide insulating layers such that said low temperature oxide insulating layer remains adjacent to said first oxide insulating layer which is along opposite sides of said gate member for forming spacers;

(d) forming source and drain regions in said substrate adjacent to a portion of said substrate underlying said gate member and its spacers;

(e) removing said spacers;

(f) annealing said silicide layer of said gate member in a furnace having substantially pure nitrogen ambient after removing said spacers, wherein said annealing step inhibits tungsten atoms from reacting with oxygen atoms during reoxidation and frees silicon atoms from said polysilicon layer;

(g) forming said reoxidation layer over said gate member by introducing oxygen into said furnace, wherein oxygen atoms react with said silicon atoms to form said reoxidation layer such that said reoxidation layer is substantially planarized and uncontaminated.

7. The method of claim 6 wherein said substantially pure nitrogen ambient is comprised of at least 99.5% nitrogen.

8. The method of claim 7 wherein said furnace is preheated to a temperature of approximately 775° C. and said annealing step is approximately 9 minutes in duration at said temperature.

9. The method of claim 7 wherein said furnace temperature is approximately 700° C. and said annealing step is approximately 30 minutes in duration.

10. The method of claim 8 wherein said oxygen is introduced into said furnace for approximately 60 minutes at 920° C. to grow said reoxidation layer.

11. The method of claim 9 wherein said oxygen is introduced into said furnace for approximately 60 minutes at 920° C. to grow said reoxidation layer.

12. The method of claim 7 wherein said low temperature oxide insulating layer is formed by a low temperature thermal oxide technique using a chemical vapor deposition technique.

* * * * *